United States Patent
Onishi et al.

(10) Patent No.: US 6,696,728 B2
(45) Date of Patent: Feb. 24, 2004

(54) SUPER-JUNCTION SEMICONDUCTOR DEVICE

(75) Inventors: Yasuhiko Onishi, Nagano (JP); Tatsuhiko Fujihira, Nagano (JP); Katsunori Ueno, Nagano (JP); Susumu Iwamoto, Nagano (JP); Takahiro Sato, Nagano (JP); Tatsuji Nagaoka, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 10/099,449

(22) Filed: Mar. 15, 2002

(65) Prior Publication Data

US 2002/0171093 A1 Nov. 21, 2002

(30) Foreign Application Priority Data

Mar. 15, 2001 (JP) ......................................... 2001-074188

(51) Int. Cl.[7] .......................... H01L 29/76; H01L 29/94; H01L 31/062; H01L 31/113; H01L 31/119
(52) U.S. Cl. ..................................... 257/341; 257/339
(58) Field of Search ............................... 257/303, 316, 257/319, 327, 336, 339, 341, 342, 343, 344, 373, 408, 409, 133, 135, 192, 345, 349, 404, 335, 138, 100

(56) References Cited

FOREIGN PATENT DOCUMENTS

| JP | 2000-277726 A | 10/2000 |
|---|---|---|
| JP | 2000-286417 A | 10/2000 |

*Primary Examiner*—Wael Fahmy
*Assistant Examiner*—Dana Farahani
(74) *Attorney, Agent, or Firm*—Rossi & Associates (57) ABSTRACT

To provide a super-junction MOSFET reducing the tradeoff relation between the on-resistance and the breakdown voltage greatly and having a peripheral structure, which facilitates reducing the leakage current in the OFF-state thereof and stabilizing the breakdown voltage thereof. The vertical MOSFET according to the invention includes a drain drift region including a first alternating conductivity type layer; a breakdown withstanding region (peripheral region) including a second alternating conductivity type layer around drain drift region, second alternating conductivity type layer being formed of layer-shaped vertically-extending n-type regions and layer-shaped vertically-extending p-type regions laminated alternately; an n-type region around second alternating conductivity type layer; and a p-type region formed in the surface portion of n-type region to reduce the leakage current in the OFF-state of the MOSFET.

28 Claims, 10 Drawing Sheets

SUPER-JUNCTION SEMICONDUCTOR DEVICE

FIELD OF THE INVENTION

The present invention relates to vertical power semiconductor devices including active devices such as MOSFETs, IGBTs and bipolar transistors, and passive devices such as diodes. Specifically, the present invention relates to vertical power super-junction semiconductor devices which facilitate realizing a high breakdown voltage and a high current capacity.

BACKGROUND OF THE INVENTION

The semiconductor devices may be classified into a lateral device, which arranges the main electrodes thereof on one major surface, and a vertical device, which distributes the main electrodes thereof on two major surfaces facing opposite to each other. In the vertical semiconductor device, a drift current flows in the thickness direction of the semiconductor chip (vertically) in the ON-state of the semiconductor device and depletion layers expand also in the thickness direction of the semiconductor chip (vertically) in the OFF-state of the semiconductor device.

Figure 9:
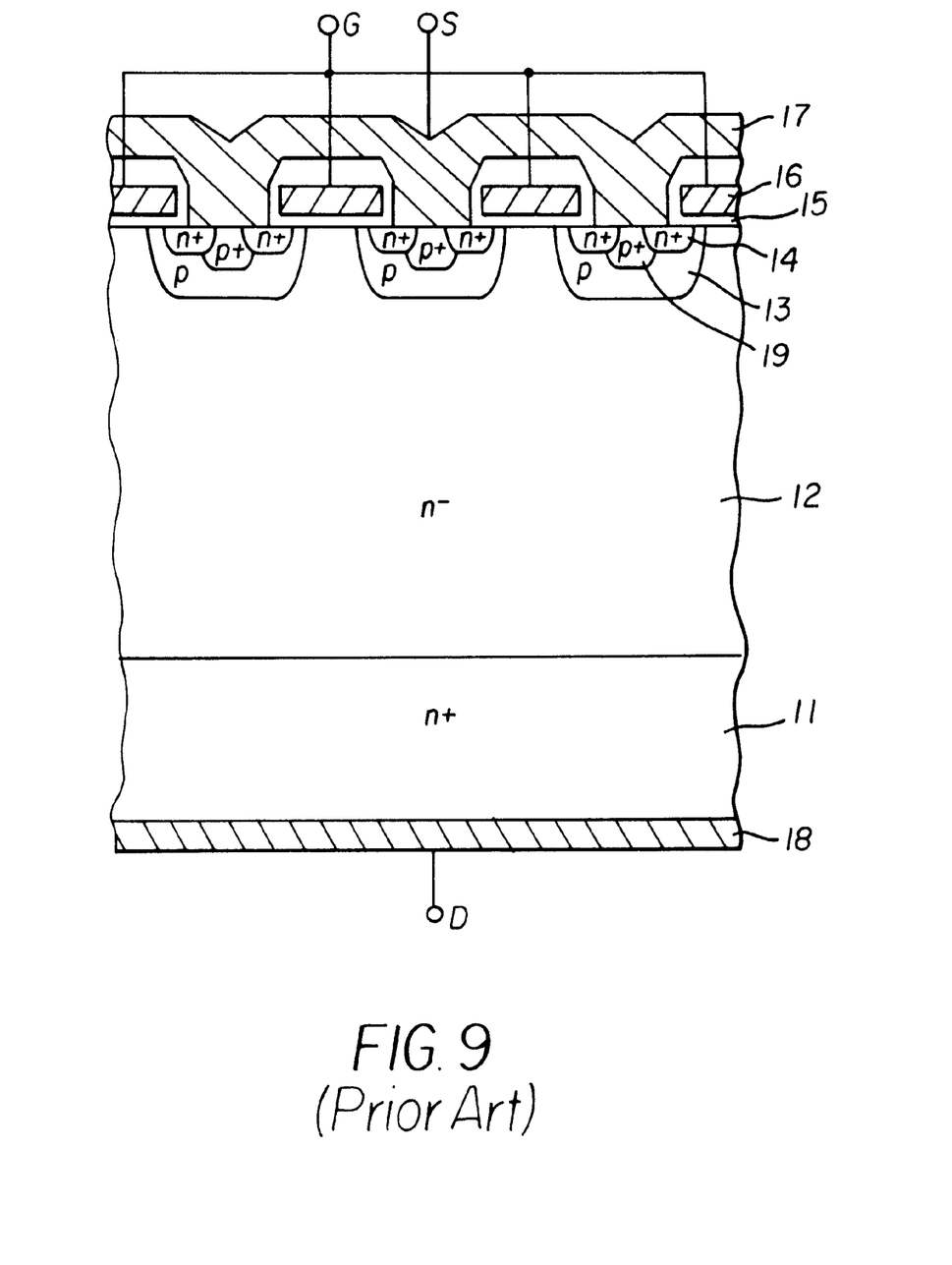
FIG. 9 is a cross sectional view of a conventional planar-type n-channel vertical MOSFET.

FIG. 9 is a cross sectional view of a conventional planar-type n-channel vertical metal oxide semiconductor field effect transistor (MOSFET). Referring now to FIG. 9, the vertical MOSFET includes a drain electrode 18 on the back surface of a semiconductor chip; an n$^+$-type drain layer 11 with low electrical resistance in electrical contact with drain electrode 18; a very resistive n$^-$-type drain drift layer 12 on n$^+$-type drain layer 11; p-type base regions 13 formed, as channel diffusion layers, selectively in the surface portion of n$^-$-type drain drift layer 12; a heavily doped n$^+$-type source region 14 formed selectively in the surface portion of p-type base region 13; a heavily doped p$^+$-type contact region 19 formed selectively in the surface portion of p-type base region 13 for realizing ohmic contact; a polycrystalline silicon gate electrode layer 16 above the extended portion of p-type base region 13 extended between n$^+$-type source region 14 and very resistive n$^-$-type drain drift layer 12 with a gate insulation film 15 interposed therebetween; and a source electrode layer 17 in contact with n$^+$-type source regions 14 and p$^+$-type contact regions 19. In the vertical semiconductor device as described above, n$^-$-type drain drift layer 12 works as a layer, through which a drift current flows vertically in the ON-state of the MOSFET. In the OFF-state of the MOSFET, n$^-$-type drain drift layer 12 is depleted by the depletion layers expanding in the depth direction thereof (vertically) from the pn-junctions between n$^-$-type drain drift layer 12 and p-type base regions 13, resulting in a high breakdown voltage.

Thinning very resistive n$^-$-type drain drift layer 12, that is shortening the drift current path, facilitates substantially reducing the on-resistance (the resistance between the drain and the source), since the drift resistance in the ON-state of the semiconductor device is reduced. However, thinning very resistive n$^-$-type drain drift layer 12 narrows the width between the drain and the base region, for which depletion layers expand from the pn-junctions between n$^-$-type drain drift layer 12 and p-type base regions 13. Due to the narrow expansion width of the depletion layers, the depletion electric field strength soon reaches the maximum (critical) value for silicon. Therefore, breakdown is caused at a voltage lower than the designed breakdown voltage of the semiconductor device. A high breakdown voltage is obtained by thickening the n$^-$-type drain drift layer 12. However, a thick n$^-$-type drain drift layer 12 inevitably causes high on-resistance, which further causes on-loss increase. In other words, there exists a tradeoff relation between the on-resistance (current capacity) and the breakdown voltage. The tradeoff relation between the on-resistance (current capacity) and the breakdown voltage exists in other semiconductor devices, which include a drift layer, such as IGBTs, bipolar transistors and diodes. The tradeoff relation between the on-resistance (current capacity) and the breakdown voltage also exists in lateral semiconductor devices, in which the flow direction of the drift current in the ON-state and the expansion direction of the depletion layers in the OFF-state are different.

European Patent 0 053 854, U.S. Pat. No. 5,216,275, U.S. Pat. No. 5,438,215, Japanese Unexamined Laid Open Patent Application H09-266311 and Japanese Unexamined Laid Open Patent Application H10-223896 disclose semiconductor devices, which facilitate reducing the tradeoff relation between the on-resistance and the breakdown voltage. The drift layers of the disclosed semiconductor devices are formed of an alternating-conductivity-type drain drift layer including heavily doped n-type regions and heavily doped p-type regions arranged alternately. Hereinafter, the alternating-conductivity-type drain drift layer will be referred to sometimes as the "first alternating conductivity type layer" or simply as the "drain drift region".

Figure 10:
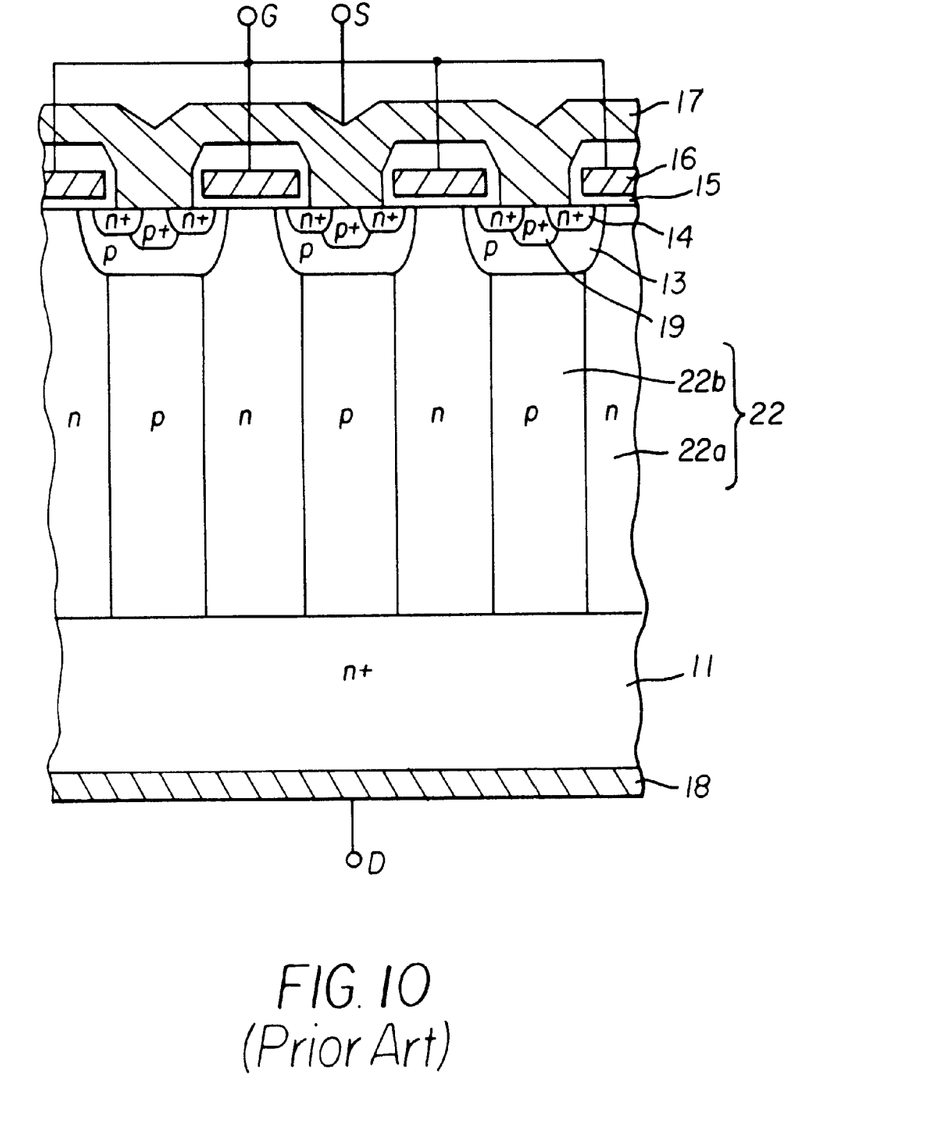
FIG. 10 is a cross sectional view of the vertical MOSFET disclosed in U.S. Pat. No. 5,216,275.

FIG. 10 is a cross sectional view of the vertical MOSFET disclosed in U.S. Pat. No. 5,216,275. Referring now to FIG. 10, the drift layer of the vertical MOSFET is not a uniform n$^-$-type layer (impurity diffusion layer) but a drain drift region 22 formed of thin n-type drift current path regions 22a and thin p-type partition regions 22b laminated alternately. Hereinafter, the n-type drift current path regions will be referred to as the "n-type drift regions". The n-type drift regions 22a and p-type partition regions 22b are shaped with respective thin layers extending vertically. The bottom of p-type base region 13 is connected with p-type partition region 22b. The n-type drift region 22a is extended between adjacent p-type base regions 13 and 13. Although alternating conductivity type layer 22 is doped heavily, a high breakdown voltage is obtained, since alternating conductivity type layer 22 is depleted quickly by the depletion layers expanding laterally in the OFF-state of the MOSFET from the pn-junctions extending vertically across alternating conductivity type layer 22. Hereinafter, the semiconductor device which includes drain drift region 22 formed of an alternating conductivity type layer, which makes a current flow in the ON-state and is depleted in the OFF-state, will be referred to as the "super-junction semiconductor device".

Although the channel stopper region in the breakdown withstanding region is of the same conductivity type with that of the drift layer usually, the channel stopper region is of the opposite conductivity type opposite to that of the drift layer sometimes depending on the manufacturing process. That is, the n-channel vertical MOSFET, the drift layer thereof is of n-type, includes a channel stopper region of p-type. In this case, the breakdown voltage of the MOSFET is stabilized by extending the channel stopper electrode connected to the outermost p-type region to the side of the active region so that the depletion layer in the peripheral portion of the MOSFET may not reach the outermost p-type region.

However, this structure causes a large leakage current in the n-channel super-junction MOSFET including an alternating conductivity type layer formed of p-type regions and n-type regions arranged alternately in the peripheral portion thereof, since the plural p-type regions of the alternating conductivity type layer connected to the plural p-type base regions in the active region is connected to one of the p-type regions in the channel stopper region. Increase of the leakage current causes not only increase of the losses in the OFF-state of the MOSFET but also breakdown of the MOSFET by thermal runaway.

In view of the foregoing, it would be desirable to provide a super-junction MOSFET reducing the tradeoff relation between the on-resistance and the breakdown voltage greatly and having a peripheral structure, which facilitates reducing the leakage current in the OFF-state thereof and stabilizing the breakdown voltage thereof.

SUMMARY OF THE INVENTION

According to a first embodiment of the invention, there is provided a semiconductor device including: a semiconductor chip having a first major surface and a second major surface facing opposite to the first major surface; an active region on the side of the first major surface; a layer with low electrical resistance of a first conductivity type on the side of the second major surface; a vertical drain drift region between the active region and the layer with low electrical resistance; the vertical drain drift region including a first alternating conductivity type layer formed of layer-shaped vertically-extending first regions of the first conductivity type and layer-shaped vertically-extending second regions of a second conductivity type, the first regions and the second regions being laminated alternately; a breakdown withstanding region between the first major surface and the layer with low electrical resistance, the breakdown withstanding region surrounding the vertical drain drift region, the breakdown withstanding region providing substantially no current path in the ON-state of the semiconductor device, the breakdown withstanding region being depleted in the OFF-state of the semiconductor device; the breakdown withstanding region including a second alternating conductivity type layer formed of layer-shaped vertically-extending third regions of the first conductivity type and layer-shaped vertically-extending fourth regions of the second conductivity type, the third regions and the fourth regions being laminated alternately; a fifth region of the first conductivity type around the second alternating conductivity type layer; and a sixth region of the second conductivity type around the fifth region. Advantageously, the fifth region separates the sixth region from the second alternating conductivity type layer. Advantageously, the fifth region is connected to the layer with low electrical resistance.

The semiconductor device according the invention facilitates reducing the leakage current, since the structure, which separates the sixth region from the second alternating conductivity type layer by the fifth region, interrupts the leakage current path. The structure, in which the fifth region is connected to the layer with low electrical resistance, facilitates stabilizing the breakdown voltage.

Advantageously, the semiconductor device according to the invention further includes an electrode connected electrically to the sixth region and arranged above the fifth region with an insulation film interposed between them. Advantageously, the electrode is extended at least over a part of the second alternating conductivity type layer with the insulation film interposed between them.

The electrode arranged as described above prevents depletion layers from reaching the sixth region of the second conductivity type under application of a reverse bias voltage and improves the reliability of the breakdown voltage.

Advantageously, a first pitch of repeating, at which a pair of the first region and the second region is repeated in the first alternating conductivity type layer, is wider than a second pitch of repeating, at which a pair of the third region and the fourth region is repeated in the second alternating conductivity type layer.

Advantageously, the first regions, the second regions, the third regions and the fourth regions are shaped with respective stripes in a horizontal plane. Advantageously, the boundaries between the first regions and the second regions in the first alternating conductivity type layer extend almost in parallel or almost in perpendicular to the boundaries between the third regions and the fourth regions in the second alternating conductivity type layer.

In other words, the planar stripes of the first regions and the second regions in the first alternating conductivity type layer are extended in parallel to or in perpendicular to the planar stripes of the third regions and the fourth regions in the second alternating conductivity type layer with no problem as far as the fifth region separates the sixth region from the second alternating conductivity type layer.

According to a second embodiment of the invention, there is provided a semiconductor device including: a semiconductor chip having a first major surface and a second major surface facing opposite to the first major surface; an active region on the side of the first major surface; a layer with low electrical resistance of a first conductivity type on the side of the second major surface; a vertical drain drift region between the active region and the layer with low electrical resistance; the vertical drain drift region including a first alternating conductivity type layer formed of layer-shaped vertically-extending first regions of the first conductivity type and layer-shaped vertically-extending second regions of a second conductivity type, the first regions and the second regions being laminated alternately; a very resistive region between the first major surface and the layer with low electrical resistance, the very resistive region surrounding the vertical drain drift region, the very resistive region being doped with an impurity of the first conductivity type and an impurity of the second conductivity type; a third region of the first conductivity type around the very resistive region; and a fourth region of the second conductivity type around the third region. Advantageously, the third region separates the fourth region from the very resistive region.

The semiconductor device according the second embodiment of the invention facilitates reducing the leakage current, since the structure, which separates the fourth region of the second conductivity type from the very resistive region by the third region of the first conductivity type, interrupts the leakage current path under application of a reverse bias voltage.

BRIEF DESCRIPTION OF THE DRAWINGS

The invention will now be described with reference to certain preferred embodiments thereof and the accompanying drawings, wherein.

DETAILED DESCRIPTION OF THE INVENTION

Now the invention will be explained in detail hereinafter with reference to the accompanying drawings which illustrate the preferred embodiments of the invention.

In the following descriptions, the n-type layer or the n-type region is a layer or a region, in which electrons are majority carriers. The p-type layer or the p-type region is a layer or a region, in which holes are majority carriers. The suffix "+" on the right shoulder of the letter "n" or "p" indicating the conductivity type of the layer or the region indicates that the region or the layer is doped relatively heavily. The suffix "−" on the right shoulder of the letter "n" or "p" indicating the conductivity type of the layer or the region indicates that the region or the layer is doped relatively lightly.

First Embodiment

Figure 1:
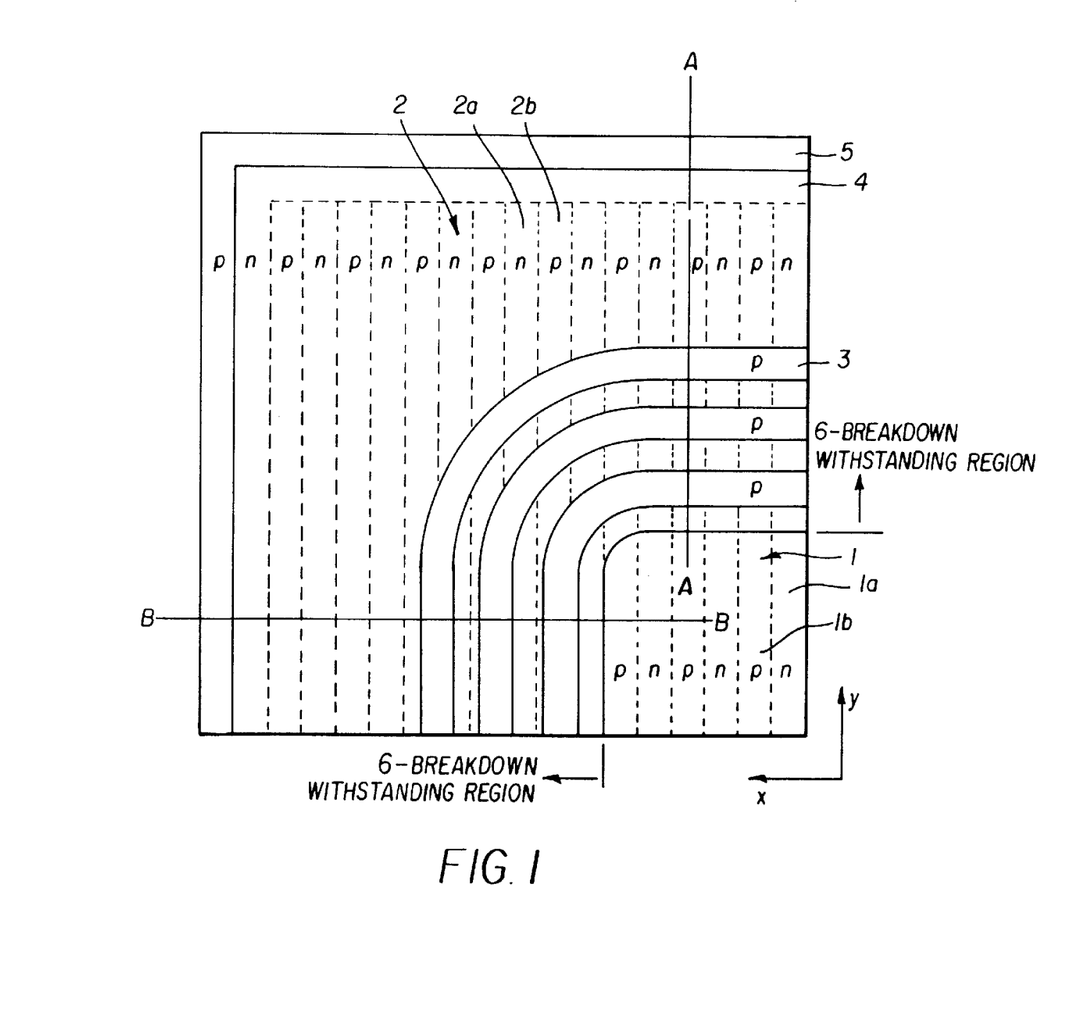
FIG. 1 is a top plan view of a vertical MOSFET according to the first embodiment of the invention showing a quarter of the rectangular semiconductor chip thereof including a corner.
Figure 2:
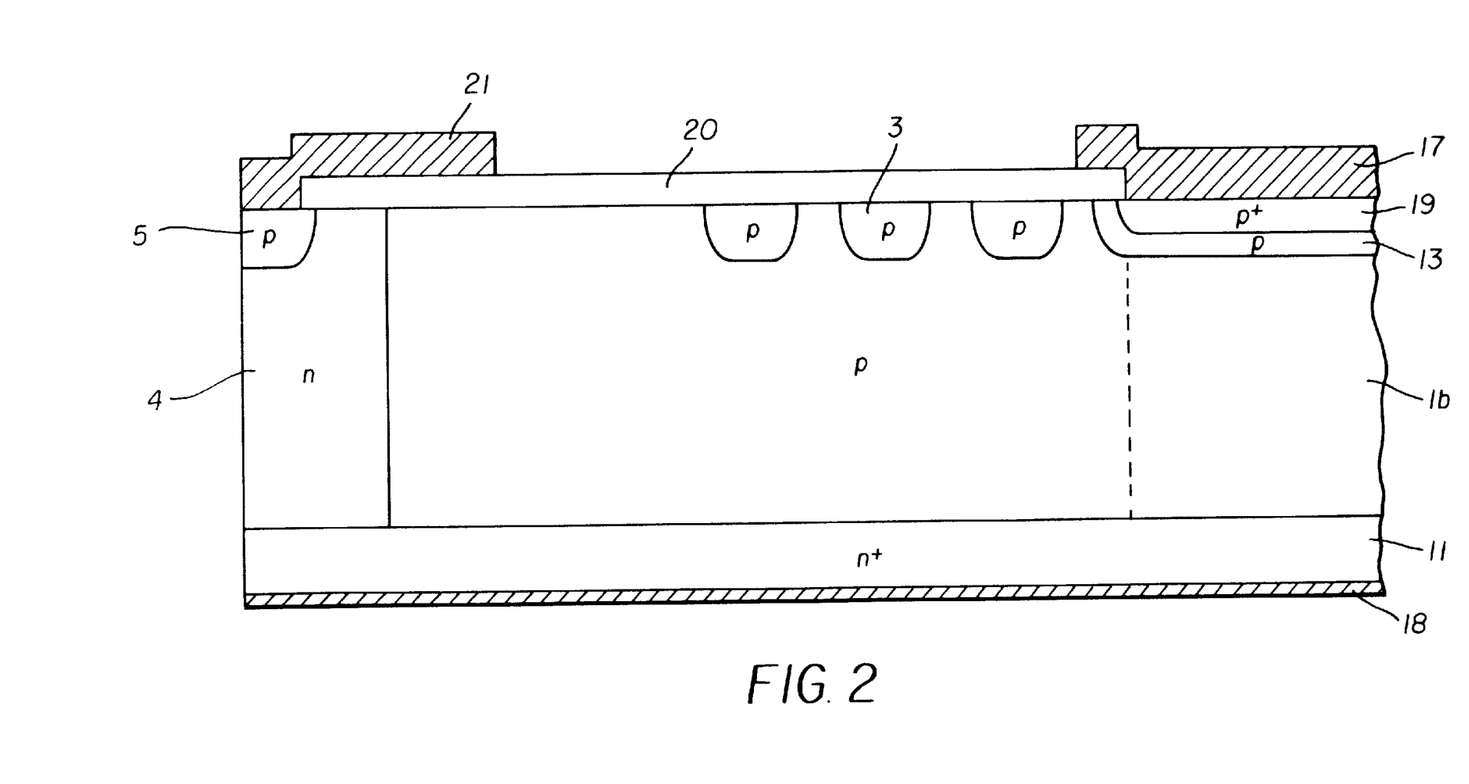
FIG. 2 is a cross sectional view along the line A—A of FIG. 1.
Figure 3:
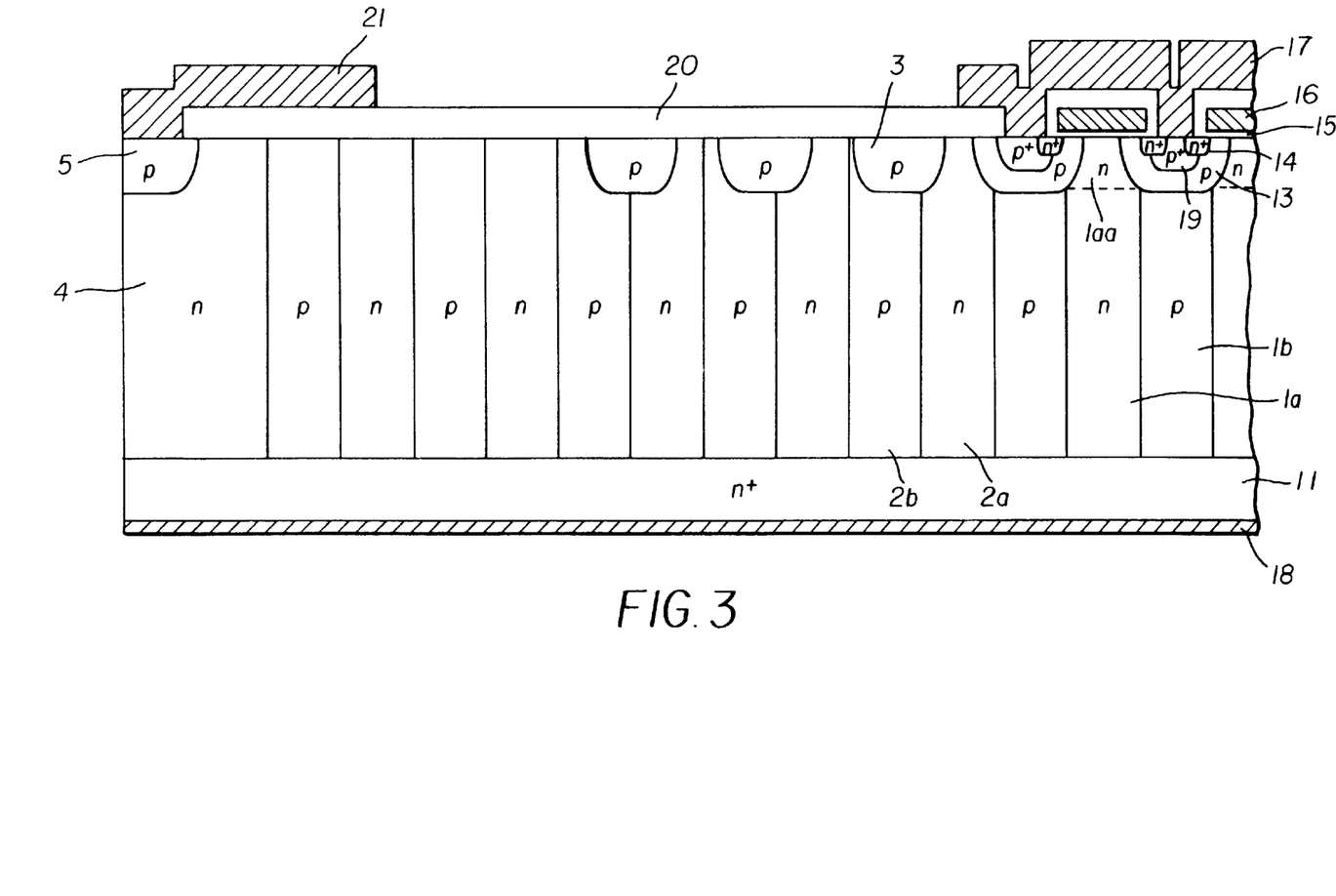
FIG. 3 is a cross sectional view along the line B—B of FIG. 1.

FIG. 1 is a top plan view of a vertical MOSFET according to a first embodiment of the invention showing a quarter of the rectangular semiconductor chip thereof including a corner. For the sake of easy understanding, only an alternating conductivity type layer (illustrated by dotted lines), guard rings 3 (illustrated by solid curves), and an outermost p-type region (illustrated by solid lines) are shown in the figure. FIG. 2 is a cross sectional view along the line A—A of FIG. 1. FIG. 3 is a cross sectional view along the line B—B of FIG. 1.

Referring now to these figures, the vertical MOSFET according to the first embodiment of the invention includes a drain electrode 18 on the back surface of a semiconductor chip; an n+-type drain layer (drain contact layer) 11 with low electrical resistance in electrical contact with drain electrode 18; a drain drift region 1 formed of a first alternating conductivity type layer; heavily doped p-type base regions (p-type wells) 13 formed selectively in the surface portion of drain drift region 1, p-type base regions 13 being shaped with rings or respective stripes; a heavily doped n−-type source region 14 formed selectively in the surface portion of p-type base region 13; a heavily doped p+-type contact region 19 in p-type base region 13, polycrystalline silicon gate electrode layers 16 above the semiconductor chip with gate insulation films 15 interposed therebetween; and a source electrode 17 in electrical contact with p+-type contact regions 19 and n+-type source regions 14 in p-type base regions 13 through the contact holes bored in an interlayer insulation film 22. The n+-type source regions 14 are formed shallowly in the respective well-shaped p-type base regions 13 such that a double-diffusion-type MOS structure is formed.

Drain drift region 1 includes a first alternating conductivity type layer 1 formed of layer-shaped n-type drift regions 1a extending in the thickness direction of the semiconductor chip (vertically) and layer-shaped p-type partition regions 1b extending in the thickness direction of the semiconductor chip (vertically). The vertically extending layers of n-type drift regions 1a and the vertically extending layers of p-type partition regions 1b are alternately laminated laterally. The n-type drift regions 1a are extended to the surface of the semiconductor chip between the adjacent p-type base regions 13. The lower end faces of n-type drift regions 1a are in contact with n+-type drain layer 11. The upper end faces of p-type partition regions 1b are in contact with the bottoms of the respective wells of p-type base regions 13 except the side faces thereof. The lower end faces of p-type partition regions 1b are in contact with n+-type drain layer In the vertical MOSFET according to the first embodiment for the breakdown voltage of the 600 V class, n-type drift region 1a is 6 µm in width and about 40 µm in depth, and p-type partition regions 1b are 6 µm in width and about 40 µm in depth. The impurity concentration is $3.0 \times 10^{15}$ cm$^{-3}$ for n-type drift regions 1a and p-type partition regions 1b.

As shown in FIG. 1, a breakdown withstanding region (peripheral portion of the device) 6 is formed around the drain drift region 1 occupying the main area of the semiconductor chip and between n+-type drain layer 11 and the surface of the semiconductor chip. The breakdown withstanding region 6 provides almost no current path in the ON-state of the MOSFET and is depleted in the OFF-state of the MOSFET. The breakdown withstanding region 6 includes a second alternating conductivity type layer 2 formed of layer-shaped n-type regions 2a extending in the thickness direction of the semiconductor chip (vertically) and layer-shaped p-type regions 2b extending in the thickness direction of the semiconductor chip (vertically). The vertically extending layers of n-type regions 2a and the vertically extending layers of p-type regions 2b are alternately laminated laterally. The pn-junctions in the first alternating conductivity type layer in drain drift region 1 extend in parallel to the pn-junctions in second alternating conductivity type layer 2 in breakdown withstanding region 6. In detail, the boundary planes between n-type drift regions 1a and p-type partition regions 1b in the drain drift region 1 extend in parallel to the boundary planes between n-type regions 2a and p-type regions 2b in breakdown withstanding region 6. A region of one conductivity type in the first alternating conductivity type layer in drain drift region 1 and a region of the opposite conductivity type in second alternating conductivity type layer 2 in breakdown withstanding region 6 are in contact with each other such that the alternation of the conductivity types is continuous over the regions 1 and 6. In the MOSFET according to the first embodiment, the pitch of repeating, at which a pair of n-type region 2a and p-type region 2b is repeated in breakdown withstanding region 6 is the same with the pitch of repeating, at which a pair of n-type drift region 1a and p-type partition region 1b is repeated in drain drift region 1. As shown by the dotted line in FIG. 2, the first alternating conductivity type layer in drain drift region 1 is extended to the edge portions of p-type base regions 13, and second alternating conductivity type layer 2 in breakdown withstanding region 6 is on the peripheral side of p-type base regions 13. Due to the configuration described above, the width, the depth and the impurity concentration of the constituent regions in the first alternating conductivity type layer in drain drift region 1 are the same with those of the constituent regions in second alternating conductivity type layer 2 in breakdown withstanding region 6. A thick oxide film (insulation film) 20 such as a thermal oxide film and a phosphate silicate glass (PSG) film is formed on breakdown withstanding region 6 for surface protection and for surface stabilization. A relatively thick n-type region 4 surrounds breakdown withstanding region 6. Thick n-type region 4 is electrically connected via a p-type region 5 to a peripheral electrode 21 biased at the drain potential. The n-type region 4 is connected to $n^+$-type drain layer 11. The p-type region 5 is in a part of the surface portion of n-type region 4.

The diffusion depth of p-type base region 13 is 3.0 μm. The surface impurity concentration of p-type base region 13 is $3.0 \times 10^{17}$ $cm^{-3}$. The diffusion depth of $n^+$-type source region 14 is 1.0 μm. The surface impurity concentration of $n^+$-type source region 14 is $3.0 \times 10^{20}$ $cm^{-3}$. The impurity concentration of $n^+$-type drain layer 11 is $2.0 \times 10^{18}$ $cm^{-3}$. The thickness of $n^+$-type drain layer 11 is 300 μm. The diffusion depth of outermost p-type region 5 is 3.0 μm. The surface impurity concentration of outermost p-type region 5 is $3.0 \times 10^{17}$ $cm^{-3}$. The width of outermost n-type region 4 is 50 μm (20 μm in the surface thereof). The impurity concentration of outermost n-type region 4 is $6.0 \times 10^{15}$ $cm^{-3}$. The pitch of repeating in drain drift region 1 and the pitch of repeating in breakdown withstanding region 6 are 12 μm.

The n-channel vertical MOSFET according to the first embodiment of the invention works in the following manner. When gate electrode layers 16 are biased at a predetermined positive potential, the n-channel MOSFET is brought to the ON-state thereof. Electrons are injected from source regions 14 to channel regions (n-type surface drift regions) 1aa via inversion layers induced in the surface portions of p-type base regions 13 beneath gate electrode layers 16. The injected electrons reach $n^+$-type drain layer 11 via drift regions 1a, connecting drain electrode 18 and source electrode 17 electrically.

When the positive potential is removed from gate electrode layers 16, the MOSFET is brought to the OFF-state thereof and the inversion layers vanish, electrically disconnecting drain electrode 18 and source electrode 17 from each other. When the reverse bias voltage (the voltage between the source and the drain) is high in the OFF-state, depletion layers expand from the pn-junctions between p-type base regions 13 and channel regions 1aa to p-type base regions 13 and channel regions 1aa, depleting p-type base regions 13 and channel regions 1aa. Since partition regions 1b in drain drift region 1 are connected electrically to source electrode 17 via p-type base regions 13 and since drift regions 1a in drain drift region 1 are connected electrically to drain electrode 18 via $n^+$-type drift layer 11, depletion layers expand from the pn-junctions between partition regions 1b and drift regions 1a to partition regions 1b and drift regions 1a. Therefore, drain drift region 1 is depleted quickly. Since the breakdown voltage in drain drift region 1 is sufficiently high, drain drift region 1 is doped heavily to obtain a high current capacity.

As described above, second alternating conductivity type layer 2 is formed in breakdown withstanding region 6 around drain drift region 1. Since some p-type regions 2b are connected electrically to source electrode 17 via p-type base regions 13 and since n-type regions 2a are connected electrically to drain electrode 18 via $n^+$-type drain layer 11, breakdown withstanding region 6 is depleted almost over the thickness of the semiconductor chip by the depletion layers expanding from the pn-junctions extending across breakdown withstanding region 6. The guard ring structure and the field plate structure formed on the breakdown withstanding region deplete the surface side portion of the breakdown withstanding region. Therefore, the electric field strength in breakdown withstanding region 6 is relaxed greatly and a high breakdown voltage is obtained in breakdown withstanding region 6. Thus, a super-junction semiconductor device exhibiting a high breakdown voltage is obtained.

The breakdown voltage of the MOSFET according to the first embodiment is very reliable, since guard rings 3 are disposed on breakdown withstanding region 6. In detail, guard rings 3 are formed in the surface portion of breakdown withstanding region 6 surrounding drain drift region 1. Guard rings 3 are formed to electrically connect many p-type regions 2b of second alternating conductivity type layer 2 in breakdown withstanding region 6. Guard rings 3 are doped more heavily than p-type regions 2b. As the positive potential of the drain electrode is raised while the gate electrode and the source electrode are short-circuited, the alternating conductivity type layer in drain drift region 1 is depleted and depletion layers are expanded from drain drift region 1 to breakdown withstanding region 6. When any guard ring 3 is not disposed, depletion layers expand in the y-direction in p-type regions 2b, the ends thereof are connected directly to the respective p-type base regions 13. However, the electric field strength across the pn-junction between the alternating conductivity type layers of the active region and the breakdown withstanding region reaches the critical value before the depletion layers expand sufficiently in the x-direction, in which p-type regions 2b are not connected directly to p-type base regions 13, since the n-type regions are doped relatively heavily. Therefore, a high breakdown voltage is not obtained.

In the vertical MOSFET according to the first embodiment of the invention, p-type regions 2b (in the x-direction of breakdown withstanding region 6), the ends thereof are not connected directly to p-type base regions 13, are connected electrically via guard rings 3 to p-type regions 2b (in the y-direction of breakdown withstanding region 6), the ends thereof are connected directly to p-type base regions 13. The potential exhibits a distribution in the x-direction in the surface of breakdown withstanding region 6 corresponding to the distances of the guard rings in the y-direction from the active region. Therefore, the electric field across the boundary between the active region and the breakdown withstanding region in the x-direction is relaxed. Since depletion layers expand to the x-direction, a high breakdown voltage is obtained. Since the breakdown withstanding structure which employs guard rings 3 can be designed independently of the width of the alternating conductivity type layer, it is possible to realize low resistance as well as a high breakdown voltage.

Since guard rings 3 are doped more heavily than p-type regions 2b, guard rings 3 are not depleted in synchronism with the depletion of p-type regions 2b. Guard rings 3 keep functioning as voltage equalizing rings as far as they are not depleted.

Since the side face of breakdown withstanding region 6, in which a pair of the end face of n-type region 2a and the end face of p-type region 2b is repeated, is in contact with the side face of drain drift region 1, in which a pair of the end face of n-type drift region 1a and the end face of p-type partition region 1b is repeated, the depletion rate of breakdown withstanding region 6 is high. The depletion rate is the rate of depleted regions versus non-depleted regions. The breakdown voltage in breakdown withstanding region 6 of the super-junction semiconductor device including drain drift region 1 formed of the first alternating conductivity type layer is well guaranteed by second alternating conductivity type layer 2 surrounding first alternating conductivity type layer 1. Therefore, the structure of first alternating conductivity type layer 1 is optimized easily, super-junction semiconductor devices are designed under less restrictions, and practical super-junction semiconductor devices are obtained.

When the gate electrode and the source electrode are short-circuited and the positive bias voltage applied to the drain electrode is raised in the super-junction MOSFET according to the first embodiment, in which outermost p-type region 5 is connected to p-type regions 2b (in the case, in which n-type region 4 is not formed on the surface side of the semiconductor chip in FIGS. 2 and 3, and outermost p-type region 5 is connected to p-type regions 2b), the depletion layers which have expanded in the y-direction in breakdown withstanding region 6 start expanding laterally (in the y-direction). Since the potential of p-type regions 2b which have not been depleted yet is equal to the potential of outermost p-type region 5, the leakage current is suppressed at a low value as far as the outermost pn-junction along the side face of the semiconductor chip, that is the pn-junction between the regions 5 and 4, is not broken down. Since the outermost pn-junction along the side face of the semiconductor chip is broken down as the drain voltage is further raised, the leakage current increases with increase of the drain voltage. The leakage current saturates as the drain voltage is still further raised, since the alternating conductivity type layers are depleted completely. However, the loses caused in the OFF-state of the MOSFET are high, since the leakage current is high. When the super-junction MOSFET includes n-type region 4 separating outermost p-type region 5 and p-type regions 2b in alternating conductivity type layer 2 in the peripheral portion (breakdown withstanding region 6) of the super-junction MOSFET from each other, the leakage current is suppressed at a low value, since the leakage current path is interrupted as far as n-type region 4 is not depleted completely.

Moreover, peripheral electrode 21, made of Al—Si or Al, connected to p-type region 5 and arranged above n-type region 4 and second alternating conductivity type layer 2 with insulation film 20 interposed therebetween, facilitates equalizing the potential of p-type region 5 separated by n-type region 4 to the drain potential. Due to the scheme described above, depletion layers hardly expand outward beyond the edge of peripheral electrode 21, n-type region 4 is prevented from being punched through, and the potential of the outermost portion of the semiconductor chip is fixed at a certain value. Therefore, the breakdown voltage is stabilized.

A field plate structure, a reduced surface electric field structure (RESURF structure) or a combination of these structures may be used in substitution for guard rings 3, which the super-junction MOSFET according to the first embodiment employs.

The length in the depth direction (thickness) of each alternating conductivity type layer is set corresponding to the breakdown voltage class. For example, the thickness of each alternating conductivity type layer is around 60.0 $\mu$m for the breakdown voltage of the 900 V class.

Second Embodiment

Figure 4:
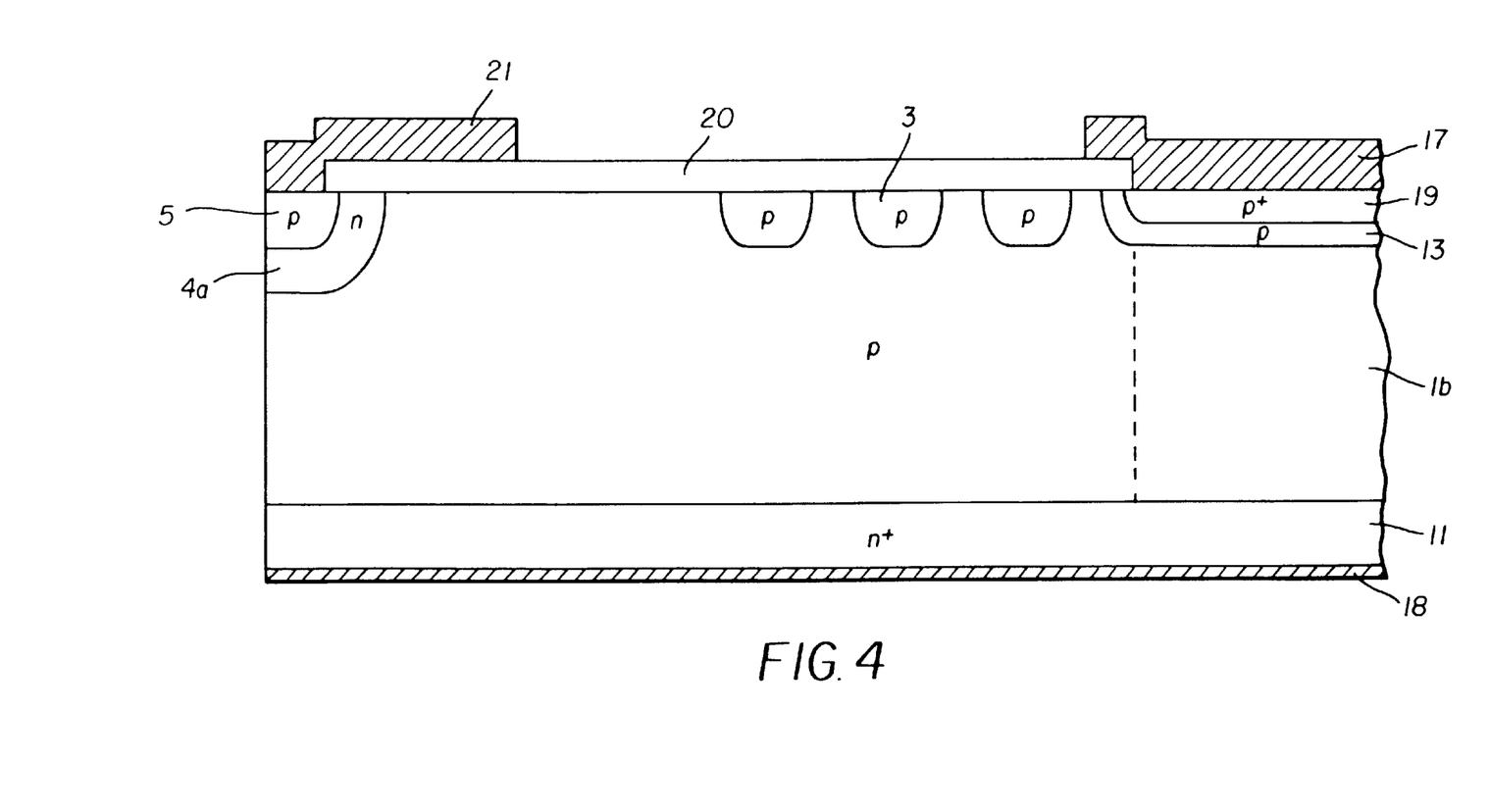
FIG. 4 is a cross sectional view of a vertical MOSFET according to the second embodiment of the invention.
Figure 5:
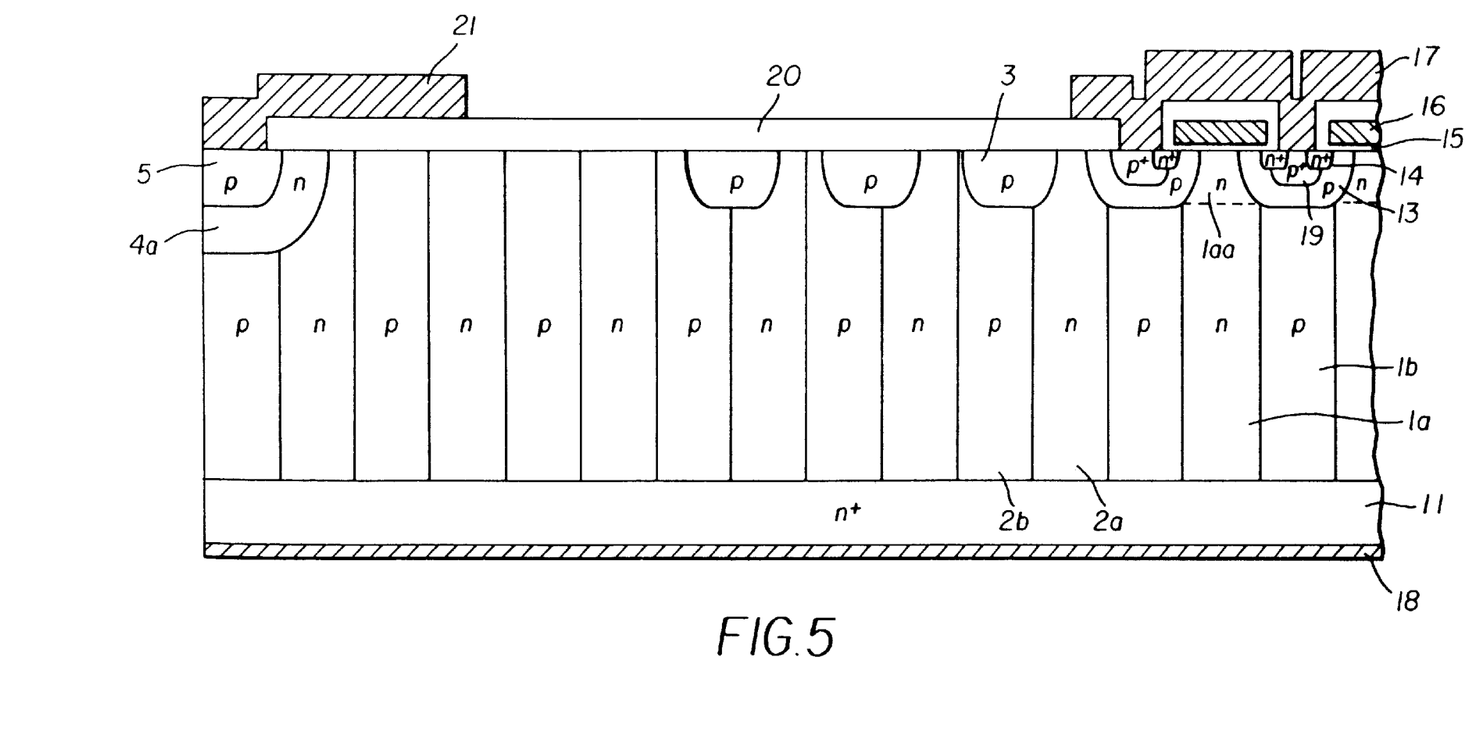
FIG. 5 is a cross sectional view perpendicular to the cross sectional view shown in FIG. 4 of the vertical MOSFET according to the second embodiment of the invention.

FIG. 4 is a cross sectional view of a vertical MOSFET according to a second embodiment of the invention. FIG. 5 is a cross sectional view perpendicular to the cross sectional view shown in FIG. 4 of the vertical MOSFET according to the second embodiment of the invention. The area shown in FIG. 4 corresponds to the cross section along A—A of FIG. 1 shown in FIG. 2. The area shown in FIG. 5 corresponds to the cross section along B—B of FIG. 1 shown in FIG. 3.

The MOSFET according to the second embodiment is different from the MOSFET according to the first embodiment in that an n-type region 4a is formed only on the surface side of the semiconductor chip of the MOSFET according to the second embodiment. The n-type region 4a is connected to n-type regions 2a of second alternating conductivity type layer 2 in the x- and y-directions. Since n-type region 4a is biased at the drain potential as far as n-type region 4a is not depleted, the MOSFET according to the second embodiment exhibits the same effects as the MOSFET according to the first embodiment does.

Third Embodiment

Figure 6:
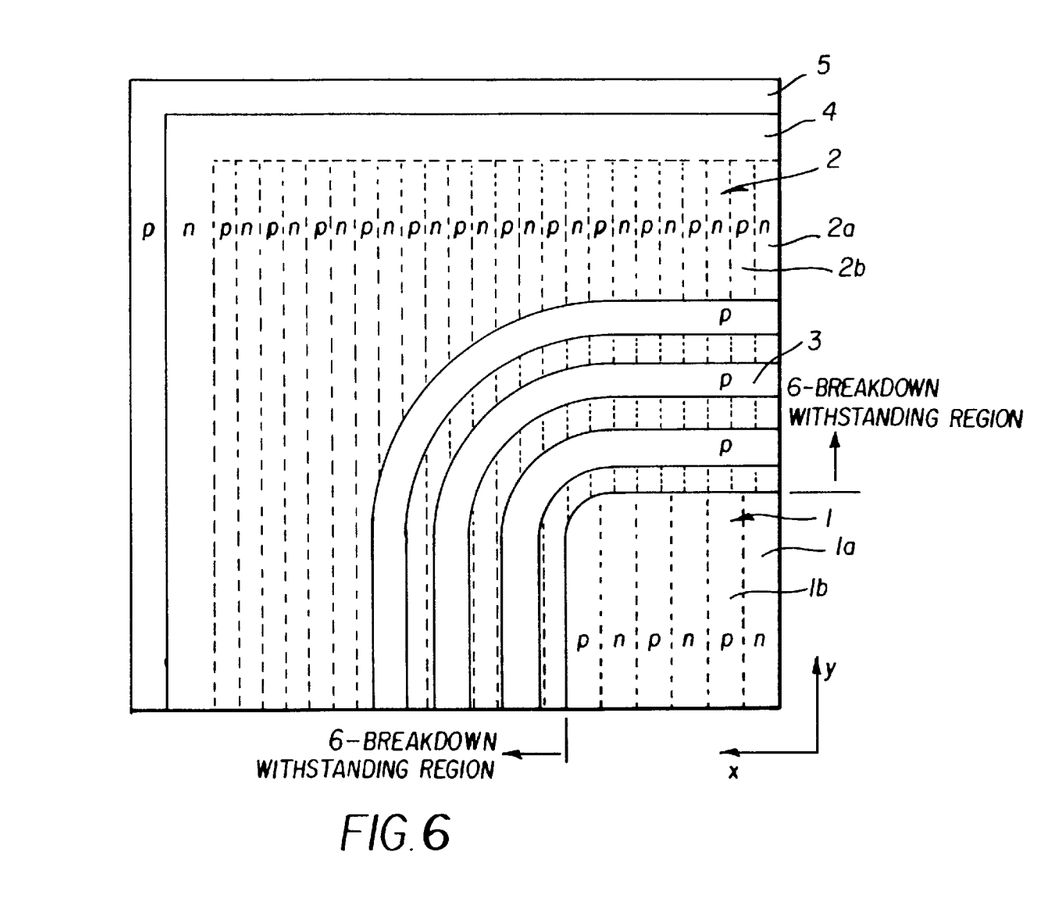
FIG. 6 is a top plan view of a vertical MOSFET according to the third embodiment of the invention showing a quarter of the rectangular semiconductor chip thereof including a corner.

FIG. 6 is a top plan view of a vertical MOSFET according to a third embodiment of the invention showing a quarter of the rectangular semiconductor chip thereof including a corner.

Referring now to FIG. 6, the vertical MOSFET according to the third embodiment includes a drain drift region 1 and a breakdown withstanding region 6. Drain drift region 1 includes a first alternating conductivity type layer formed of layer-shaped vertically-extending n-type drift regions 1a and layer-shaped vertically-extending p-type partition regions 1b arranged alternately. Breakdown withstanding region 6 includes a second alternating conductivity type layer 2 formed of layer-shaped vertically-extending n-type regions 2a and layer-shaped vertically-extending p-type regions 2b arranged alternately. The second pitch of repeating, at which a pair of n-type region 2a and p-type region 2b is repeated in breakdown withstanding region 6 is narrower than the first pitch of repeating, at which a pair of n-type drift region 1a and p-type partition region 1b is repeated in drain drift region 1. The boundaries (pn-junctions) between n-type regions 2a and p-type regions 2b in breakdown withstanding region 6 extend in parallel to the boundaries (pn-junctions) between n-type drift regions 1a and p-type partition regions 1b in drain drift region 1. The second pitch of repeating narrower than the first pitch of repeating makes it easier to expand depletion layers across a unit area in breakdown withstanding region 6 and to obtain a higher breakdown voltage in breakdown withstanding region 6 than in drain drift region 1. Since n-type region 4 interrupts the leakage current flowing in the y-direction, the vertical MOSFET according to the third embodiment facilitates suppressing the leakage current at a low value. The thickness is 3.0 $\mu$m for n-type regions 2a and p-type regions 2b in breakdown withstanding region 6. The impurity concentration is 3.0× $10^{14}$ cm$^{-3}$ for n-type regions 2a and p-type regions 2b in breakdown withstanding region 6, which is lower than the impurity concentration in drain drift region 1. Alternatively, the first pitch of repeating and the second pitch of repeating are set at the same value, and second alternating conductivity type layer 2 is doped more lightly than the first alternating conductivity type layer in drain drift region 1.

Fourth Embodiment

Figure 7:
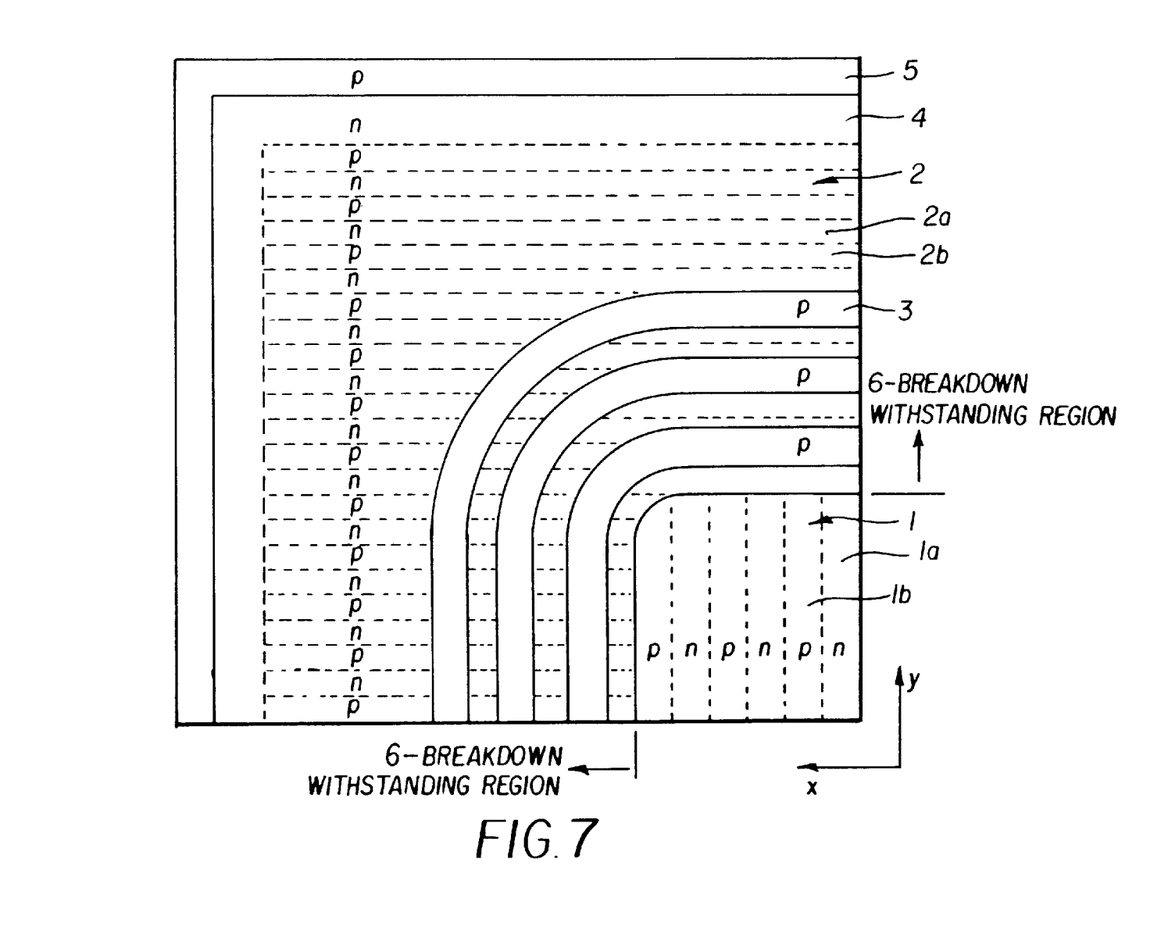
FIG. 7 is a top plan view of a vertical MOSFET according to the fourth embodiment of the invention showing a quarter of the rectangular semiconductor chip thereof including a corner.

FIG. 7 is a top plan view of a vertical MOSFET according to the fourth embodiment of the invention showing a quarter of the rectangular semiconductor chip thereof including a corner.

Referring now to FIG. 7, the MOSFET according to the fourth embodiment is a modification of the MOSFET according to the third embodiment. In the MOSFET according to the fourth embodiment, the boundaries (pn-junctions)

between n-type regions 2a and p-type regions 2b in breakdown withstanding region 6 extend in perpendicular to the boundaries (pn-junctions) between n-type drift regions 1a and p-type partition regions 1b in drain drift region 1.

The boundaries (pn-junctions) between n-type regions 2a and p-type regions 2b in breakdown withstanding region 6 may extend in parallel or in perpendicular to the boundaries (pn-junctions) between n-type drift regions 1a and p-type partition regions 1b in drain drift region 1. Preferably, a p-type region 5 in the outermost peripheral portion is separated from second alternating conductivity type layer 2 by an n-type region 4.

Fifth Embodiment

Figure 8:
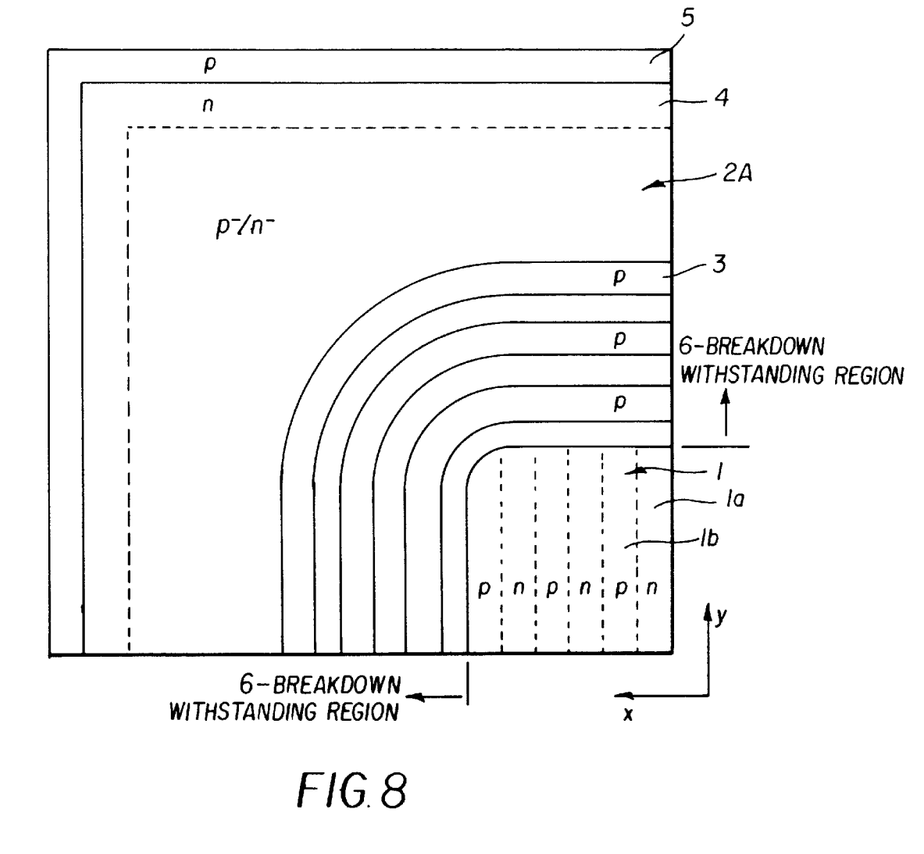
FIG. 8 is a top plan view of a vertical MOSFET according to the fifth embodiment of the invention showing a quarter of the rectangular semiconductor chip thereof including a corner.

FIG. 8 is a top plan view of a vertical MOSFET according to a fifth embodiment of the invention showing a quarter of the rectangular semiconductor chip thereof including a corner.

Referring now to FIG. 8, the vertical MOSFET according to the fifth embodiment includes a breakdown withstanding region 6 including a very resistive region (i-layer) 2A doped with an n-type impurity and a p-type impurity. When almost the same amounts of an n-type impurity and a p-type impurity are contained in the same region, these impurities of the opposite conductivity types compensate each other, resulting in a very resistive region (i-layer). Or, when almost the same amounts of an n-type impurity and a p-type impurity are contained in the respective regions positioned in close proximity, these impurities of the opposite conductivity types compensate each other, resulting also in a very resistive region (i-layer). In practice, the very resistive region is of an n-type or of a p-type.

When the very resistive layer is of an n-type, any leakage current path will not be caused, even if an n-type region 4 for isolating an p-type region 5 in the outermost peripheral portion of the semiconductor chip is not disposed. However, when the very resistive layer is of a p-type, leakage current paths will be caused in the x- and y-directions, since the very resistive layer is connected to the source regions. Therefore, it is necessary to isolate p-type region 5 by n-type region 4.

Although the invention has been described in connection with the vertical MOSFETs, the invention is applicable to the vertical active devices having three or more terminals such as IGBTs (conductivity-modulation-type MOSFET) and bipolar transistors and to passive devices having two terminals such as free-wheeling diodes (FWDs) and Schottky diodes.

As described above, the vertical super-junction MOSFET according to the invention includes a breakdown withstanding region including an alternating conductivity type layer surrounding the drain drift region and an n-type region for isolating the p-type region formed in the outermost peripheral portion of the semiconductor chip from the p-type regions of the alternating conductivity type layer in the breakdown withstanding region. The vertical MOSFET according to the invention facilitates reducing the tradeoff relation between the on-resistance and the breakdown voltage, reducing the leakage current, and improving the reliability of the breakdown voltage.

What is claimed is:

1. A semiconductor device comprising:
   a semiconductor chip having a first major surface and a second major surface facing opposite to the first major surface;
   an active region on the side of the first major surface;
   a layer with low electrical resistance of a first conductivity type on the side of the second major surface;
   a vertical drain drift region between the active region and the layer with low electrical resistance;
   the vertical drain drift region comprising a first alternating conductivity type layer formed of first regions of the first conductivity type and second regions of a second conductivity type, the first regions and the second regions being laminated alternately;
   a breakdown withstanding region between the first major surface and the layer with low electrical resistance, the breakdown withstanding region surrounding the vertical drain drift region;
   the breakdown withstanding region comprising a second alternating conductivity type layer formed of third regions of the first conductivity type and fourth regions of the second conductivity type, the third regions and the fourth regions being laminated alternately;
   a fifth region of the first conductivity type around the second alternating conductivity type layer; and
   a sixth region of the second conductivity type around the fifth region.

2. The semiconductor device according to claim 1, wherein the fifth region separates the sixth region from the second alternating conductivity type layer.

3. The semiconductor device according to claim 1, wherein the fifth region is connected to the layer with low electrical resistance.

4. The semiconductor device according to claim 1, further comprising an electrode connected electrically to the sixth region, the electrode being arranged above the fifth region with an insulation film interposed therebetween.

5. The semiconductor device according to claim 4, wherein the electrode is extended at least over a part of the second alternating conductivity type layer with the insulation film interposed therebetween.

6. The semiconductor device according to claim 1, wherein a first pitch of repeating, at which a pair of the first region and the second region is repeated in the first alternating conductivity type layer, is wider than a second pitch of repeating, at which a pair of the third region and the fourth region is repeated in the second alternating conductivity type layer.

7. The semiconductor device according to claim 1, wherein the first regions, the second regions, the third regions and the fourth regions are shaped with respective stripes in a horizontal plane.

8. The semiconductor device according to claim 7, wherein the boundaries between the first regions and the second regions in the first alternating conductivity type layer extend almost in perpendicular to the boundaries between the third regions and the fourth regions in the second alternating conductivity type layer.

9. The semiconductor device according to claim 7, wherein the boundaries between the first regions and the second regions in the first alternating conductivity type layer extend almost in parallel to the boundaries between the third regions and the fourth regions in the second alternating conductivity type layer.

10. A semiconductor device comprising:
    a semiconductor chip having a first major surface and a second major surface facing opposite to the first major surface;
    an active region on the side of the first major surface;
    a layer with low electrical resistance of a first conductivity type on the side of the second major surface;
    a vertical drain drift region between the active region and the layer with low electrical resistance;
    the vertical drain drift region comprising a first alternating conductivity type layer formed of first regions of the first conductivity type and second regions of a second conductivity type, the first regions and the second regions being laminated alternately;

a very resistive region between the first major surface and the layer with low electrical resistance, the very resistive region surrounding the vertical drain drift region, the very resistive region being doped with an impurity of the first conductivity type and an impurity of the second conductivity type;

a third region of the first conductivity type around the very resistive region; and a fourth region of the second conductivity type around the third region.

11. The semiconductor device according to claim 10, wherein the third region separates the fourth region from the very resistive region.

12. The semiconductor device according to claim 10, wherein the third region is connected to the layer with low electrical resistance.

13. The semiconductor device according to claim 10, further comprising an electrode connected electrically to the fourth region, the electrode being arranged above the third region with an insulation film interposed therebetween.

14. The semiconductor device according to claim 13, wherein the electrode is extended at least over a part of the very resistive region with the insulation film interposed therebetween.

15. A method for manufacturing a semiconductor device comprising:

forming a semiconductor chip having a first major surface and a second major surface facing opposite to the first major surface;

forming an active region on the side of the first major surface;

forming a layer with low electrical resistance of a first conductivity type on the side of the second major surface;

forming a vertical drain drift region between the active region and the layer with low electrical resistance, the vertical drain drift region including a first alternating conductivity type layer formed of layer-shaped vertically-extending first regions of the first conductivity type and layer-shaped vertically-extending second regions of a second conductivity type, the first regions and the second regions being laminated alternately;

forming a breakdown withstanding region between the first major surface and the layer with low electrical resistance, the breakdown withstanding region surrounding the vertical drain drift region, the breakdown withstanding region providing no current path in the ON-state of the semiconductor device, the breakdown withstanding region being depleted in the OFF-state of the semiconductor device, the breakdown withstanding region including a second alternating conductivity type layer formed of layer-shaped vertically-extending third regions of the first conductivity type and layer-shaped vertically-extending fourth regions of the second conductivity type, the third regions and the fourth regions being laminated alternately;

forming a fifth region of the first conductivity type around the second alternating conductivity type layer; and forming a sixth region of the second conductivity type around the fifth region.

16. The method for manufacturing a semiconductor device according to claim 15, wherein the fifth region separates the sixth region from the second alternating conductivity type layer.

17. The method for manufacturing a semiconductor device according to claim 15, wherein the fifth region is connected to the layer with low electrical resistance.

18. The method for manufacturing a semiconductor device according to claim 15, further comprising:

forming an electrode connected electrically to the sixth region, the electrode being arranged above the fifth region with an insulation film interposed therebetween.

19. The method for manufacturing a semiconductor device according to claim 18, wherein the electrode is extended at least over a part of the second alternating conductivity type layer with the insulation film interposed therebetween.

20. The method for manufacturing a semiconductor device according to claim 15, wherein the first regions, the second regions, the third regions and the fourth regions are shaped with respective stripes in a horizontal plane.

21. The method for manufacturing a semiconductor device according to claim 15, wherein a first pitch of repeating, at which a pair of the first region and the second region is repeated in the first alternating conductivity type layer, is wider than a second pitch of repeating, at which a pair of the third region and the fourth region is repeated in the second alternating conductivity type layer.

22. The method for manufacturing a semiconductor device according to claim 15, wherein the boundaries between the first regions and the second regions in the first alternating conductivity type layer extend almost in perpendicular to the boundaries between the third regions and the fourth regions in the second alternating conductivity type layer.

23. The method for manufacturing a semiconductor device according to claim 15, wherein the boundaries between the first regions and the second regions in the first alternating conductivity type layer extend almost in parallel to the boundaries between the third regions and the fourth regions in the second alternating conductivity type layer.

24. A method for manufacturing a semiconductor device comprising:

forming a semiconductor chip having a first major surface and a second major surface facing opposite to the first major surface;

forming an active region on the side of the first major surface;

forming a layer with low electrical resistance of a first conductivity type on the side of the second major surface;

forming a vertical drain drift region between the active region and the layer with low electrical resistance;

the vertical drain drift region including a first alternating conductivity type layer formed of layer-shaped vertically-extending first regions of the fist conductivity type and layer-shaped vertically-extending second regions of a second conductivity type, the first regions and the second regions being laminated alternately;

forming a very resistive region between the first major surface and the layer with low electrical resistance, the very resistive region surrounding the vertical drain drift region, the very resistive region being doped with an impurity of the first conductivity type and an impurity of the second conductivity type;

forming a third region of the first conductivity type around the very resistive region; and forming a fourth region of the second conductivity type around the third region.

25. The method for manufacturing a semiconductor device according to claim 24, wherein the third region separates the fourth region from the very resistive region.

26. The method for manufacturing a semiconductor device according to claim 24, wherein the third region is connected to the layer with low electrical resistance.

27. The method for manufacturing a semiconductor device according to claim 15, further comprising:

forming an electrode connected electrically to the fourth region, the electrode being arranged above the third region with an insulation film interposed therebetween.

28. The method for manufacturing a semiconductor device according to claim 27, wherein the electrode is extended at least over a part of the very resistive region with the insulation film interposed therebetween.

* * * * *